United States Patent
Khlat

(10) Patent No.: US 11,018,627 B2
(45) Date of Patent: May 25, 2021

(54) MULTI-BANDWIDTH ENVELOPE TRACKING INTEGRATED CIRCUIT AND RELATED APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 39 days.

(21) Appl. No.: 16/590,790

(22) Filed: Oct. 2, 2019

(65) Prior Publication Data

US 2020/0336105 A1     Oct. 22, 2020

Related U.S. Application Data

(60) Provisional application No. 62/835,226, filed on Apr. 17, 2019.

(51) Int. Cl.
| | |
|---|---|
| H03F 1/30 | (2006.01) |
| H03F 1/02 | (2006.01) |
| H03F 3/213 | (2006.01) |
| H03F 3/21 | (2006.01) |

(52) U.S. Cl.
CPC ............ *H03F 1/0211* (2013.01); *H03F 3/211* (2013.01); *H03F 3/213* (2013.01); *H03F 2200/102* (2013.01); *H03F 2200/111* (2013.01); *H03F 2200/129* (2013.01); *H03F 2200/267* (2013.01); *H03F 2200/375* (2013.01); *H03F 2200/451* (2013.01)

(58) Field of Classification Search
CPC ....................................................... H03F 1/30
USPC ........................................ 330/297, 296, 285
See application file for complete search history.

(56) References Cited

U.S. PATENT DOCUMENTS

| | | |
|---|---|---|
| 5,838,732 A | 11/1998 | Carney |
| 6,107,862 A | 8/2000 | Mukainakano et al. |
| 6,141,377 A | 10/2000 | Sharper et al. |

(Continued)

FOREIGN PATENT DOCUMENTS

EP      3174199 A2      5/2017

OTHER PUBLICATIONS

Non-Final Office Action for U.S. Appl. No. 14/836,634, dated May 16, 2016, 9 pages.

(Continued)

*Primary Examiner* — Henry Choe
(74) *Attorney, Agent, or Firm* — Withrow & Terranova, P.L.L.C.

(57) ABSTRACT

A multi-bandwidth envelope tracking (ET) integrated circuit (IC) (ETIC) and related apparatus are provided. In a non-limiting example, the multi-bandwidth ETIC is coupled to an amplifier circuit(s) configured to amplify a radio frequency (RF) signal corresponding to a wide range of modulation bandwidth (e.g., from less than 90 KHz to over 40 MHz). In this regard, the multi-bandwidth ETIC is configured to generate different ET voltages based on the modulation bandwidth of the RF signal. By generating the ET voltages based on the modulation bandwidth of the RF signal, it may be possible to optimize operating efficiency of the amplifier circuit(s). As a result, it may be possible to improve power consumption and reduce heat dissipation in an apparatus employing the multi-bandwidth ETIC, thus making it possible to provide the multi-bandwidth ETIC in a wearable device.

20 Claims, 3 Drawing Sheets

(56) References Cited

U.S. PATENT DOCUMENTS

Figure 1:
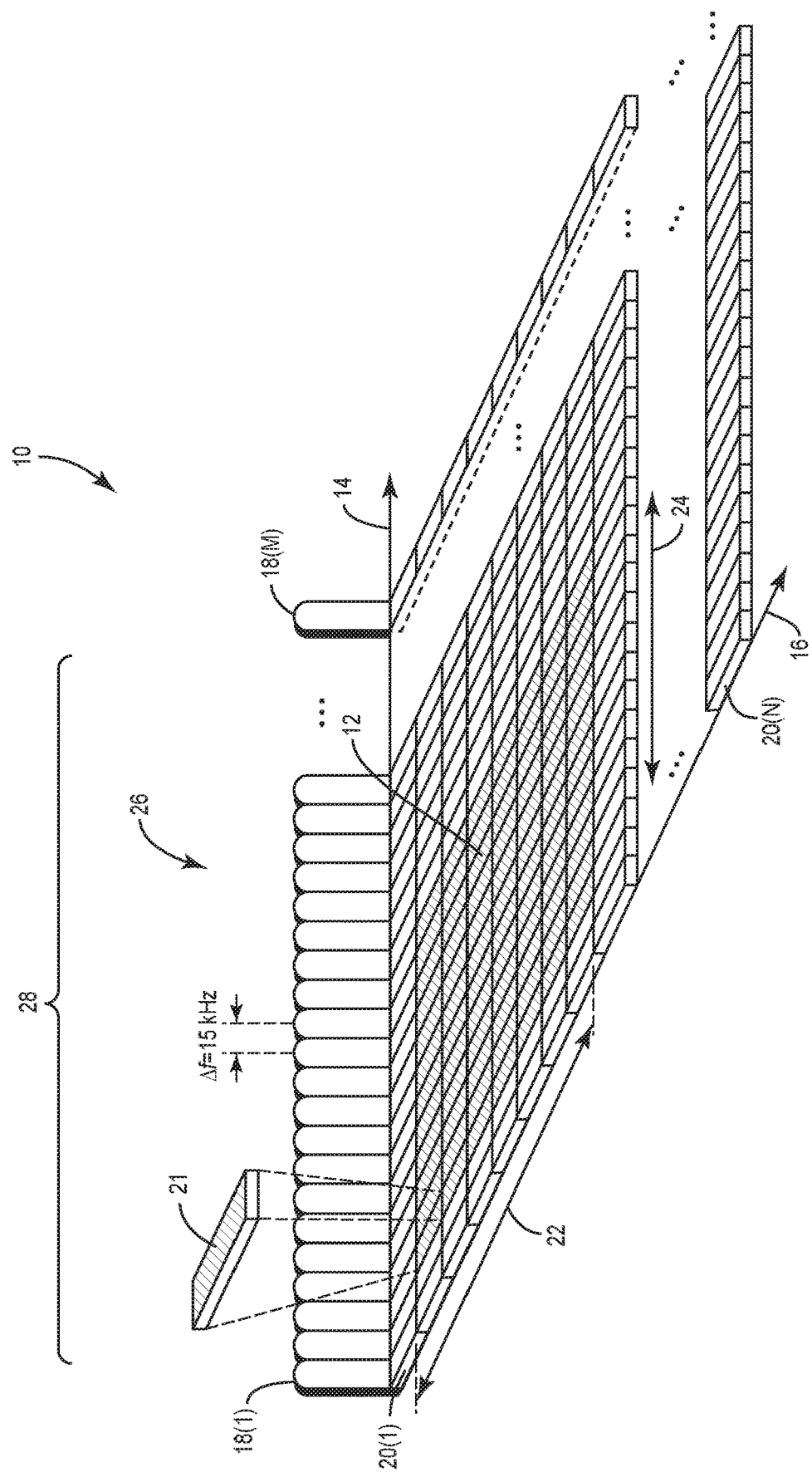

| | | |
|---|---|---|
| 6,985,033 B1 | 1/2006 | Shirali et al. |
| 7,043,213 B2 | 5/2006 | Robinson et al. |
| 7,471,155 B1 | 12/2008 | Levesque |
| 7,570,931 B2 | 8/2009 | McCallister et al. |
| 8,461,928 B2 | 6/2013 | Yahav et al. |
| 8,493,141 B2 | 7/2013 | Khlat et al. |
| 8,588,713 B2 | 11/2013 | Khlat |
| 8,718,188 B2 | 5/2014 | Balteanu et al. |
| 8,725,218 B2 | 5/2014 | Brown et al. |
| 8,774,065 B2 | 7/2014 | Khlat et al. |
| 8,803,603 B2 | 8/2014 | Wimpenny |
| 8,818,305 B1 | 8/2014 | Schwent et al. |
| 8,854,129 B2 | 10/2014 | Wilson |
| 8,879,665 B2 | 11/2014 | Xia et al. |
| 8,913,690 B2 | 12/2014 | Onishi |
| 8,989,682 B2 | 3/2015 | Ripley et al. |
| 9,020,451 B2 | 4/2015 | Khlat |
| 9,041,364 B2 | 5/2015 | Khlat |
| 9,041,365 B2 | 5/2015 | Kay et al. |
| 9,055,529 B2 | 6/2015 | Shih |
| 9,065,509 B1 | 6/2015 | Yan et al. |
| 9,069,365 B2 | 6/2015 | Brown et al. |
| 9,098,099 B2 | 8/2015 | Park et al. |
| 9,166,538 B2 | 10/2015 | Hong et al. |
| 9,166,830 B2 | 10/2015 | Camuffo et al. |
| 9,167,514 B2 | 10/2015 | Dakshinamurthy et al. |
| 9,197,182 B2 | 11/2015 | Baxter et al. |
| 9,225,362 B2 | 12/2015 | Drogi et al. |
| 9,247,496 B2 | 1/2016 | Khlat |
| 9,263,997 B2 | 2/2016 | Vinayak |
| 9,270,230 B2 | 2/2016 | Henshaw et al. |
| 9,270,239 B2 | 2/2016 | Drogi et al. |
| 9,271,236 B2 | 2/2016 | Drogi |
| 9,280,163 B2 | 3/2016 | Kay et al. |
| 9,288,098 B2 | 3/2016 | Yan et al. |
| 9,298,198 B2 | 3/2016 | Kay et al. |
| 9,344,304 B1 | 5/2016 | Cohen |
| 9,356,512 B2 | 5/2016 | Chowdhury et al. |
| 9,377,797 B2 | 6/2016 | Kay et al. |
| 9,379,667 B2 | 6/2016 | Khlat et al. |
| 9,515,622 B2 | 12/2016 | Nentwig et al. |
| 9,520,907 B2 | 12/2016 | Peng et al. |
| 9,584,071 B2 | 2/2017 | Khlat |
| 9,595,869 B2 * | 3/2017 | Lerdworatawee .... H02M 3/158 |
| 9,595,981 B2 | 3/2017 | Khlat |
| 9,596,110 B2 | 3/2017 | Jiang et al. |
| 9,614,477 B1 | 4/2017 | Rozenblit et al. |
| 9,634,666 B2 | 4/2017 | Krug |
| 9,748,845 B1 | 8/2017 | Kotikalapoodi |
| 9,806,676 B2 | 10/2017 | Balteanu et al. |
| 9,831,834 B2 | 11/2017 | Balteanu et al. |
| 9,837,962 B2 | 12/2017 | Mathe et al. |
| 9,923,520 B1 | 3/2018 | Abdelfattah et al. |
| 10,003,416 B1 | 6/2018 | Lloyd |
| 10,090,808 B1 | 10/2018 | Henzler et al. |
| 10,097,145 B1 | 10/2018 | Khlat et al. |
| 10,110,169 B2 | 10/2018 | Khesbak et al. |
| 10,158,329 B1 | 12/2018 | Khlat |
| 10,158,330 B1 | 12/2018 | Khlat |
| 10,170,989 B2 | 1/2019 | Balteanu et al. |
| 10,291,181 B2 | 5/2019 | Kim et al. |
| 10,326,408 B2 | 6/2019 | Khlat et al. |
| 10,382,071 B2 | 8/2019 | Rozek et al. |
| 10,476,437 B2 | 11/2019 | Nag et al. |
| 2002/0167827 A1 | 11/2002 | Umeda et al. |
| 2004/0266366 A1 | 12/2004 | Robinson et al. |
| 2005/0090209 A1 | 4/2005 | Behzad |
| 2005/0227646 A1 | 10/2005 | Yamazaki et al. |
| 2005/0232385 A1 | 10/2005 | Yoshikawa et al. |
| 2006/0240786 A1 | 10/2006 | Liu |
| 2007/0052474 A1 | 3/2007 | Saito |
| 2007/0258602 A1 | 11/2007 | Vepsalainen et al. |
| 2009/0016085 A1 | 1/2009 | Rader et al. |
| 2009/0045872 A1 | 2/2009 | Kenington |
| 2009/0191826 A1 | 7/2009 | Takinami et al. |
| 2010/0308919 A1 | 12/2010 | Adamski et al. |
| 2011/0074373 A1 | 3/2011 | Lin |
| 2011/0136452 A1 | 6/2011 | Pratt et al. |
| 2011/0175681 A1 | 7/2011 | Inamori et al. |
| 2011/0279179 A1 | 11/2011 | Vice |
| 2012/0194274 A1 | 8/2012 | Fowers et al. |
| 2012/0200435 A1 | 8/2012 | Ngo et al. |
| 2012/0299645 A1 | 11/2012 | Southcombe et al. |
| 2012/0299647 A1 | 11/2012 | Honjo et al. |
| 2013/0021827 A1 | 1/2013 | Ye |
| 2013/0100991 A1 | 4/2013 | Woo |
| 2013/0130724 A1 | 5/2013 | Kumar Reddy et al. |
| 2013/0162233 A1 | 6/2013 | Marty |
| 2013/0187711 A1 | 7/2013 | Goedken et al. |
| 2013/0200865 A1 | 8/2013 | Wimpenny |
| 2013/0271221 A1 | 10/2013 | Levesque et al. |
| 2014/0009226 A1 | 1/2014 | Severson |
| 2014/0028370 A1 | 1/2014 | Wimpenny |
| 2014/0028390 A1 | 1/2014 | Davis |
| 2014/0057584 A1 | 2/2014 | Khlat |
| 2014/0103995 A1 | 4/2014 | Langer |
| 2014/0155002 A1 | 6/2014 | Dakshinamurthy et al. |
| 2014/0184335 A1 | 7/2014 | Nobbe et al. |
| 2014/0199949 A1 | 7/2014 | Nagode et al. |
| 2014/0210550 A1 | 7/2014 | Mathe et al. |
| 2014/0218109 A1 | 8/2014 | Wimpenny |
| 2014/0235185 A1 | 8/2014 | Drogi |
| 2014/0266423 A1 | 9/2014 | Drogi et al. |
| 2014/0266428 A1 | 9/2014 | Chiron et al. |
| 2014/0315504 A1 | 10/2014 | Sakai et al. |
| 2014/0361830 A1 | 12/2014 | Mathe et al. |
| 2015/0048883 A1 | 2/2015 | Vinayak |
| 2015/0071382 A1 | 3/2015 | Wu et al. |
| 2015/0098523 A1 | 4/2015 | Lim et al. |
| 2015/0155836 A1 | 6/2015 | Midya et al. |
| 2015/0188432 A1 | 7/2015 | Vannorsdel et al. |
| 2015/0236654 A1 | 8/2015 | Jiang et al. |
| 2015/0236729 A1 | 8/2015 | Peng et al. |
| 2015/0280652 A1 | 10/2015 | Cohen |
| 2015/0333781 A1 | 11/2015 | Alon et al. |
| 2016/0065137 A1 | 3/2016 | Khlat |
| 2016/0099687 A1 | 4/2016 | Khlat |
| 2016/0105151 A1 | 4/2016 | Langer |
| 2016/0118941 A1 | 4/2016 | Wang |
| 2016/0126900 A1 | 5/2016 | Shute |
| 2016/0173031 A1 | 6/2016 | Langer |
| 2016/0181995 A1 | 6/2016 | Nentwig et al. |
| 2016/0187627 A1 | 6/2016 | Abe |
| 2016/0197627 A1 | 7/2016 | Qin et al. |
| 2016/0226448 A1 | 8/2016 | Wimpenny |
| 2016/0294587 A1 | 10/2016 | Jiang et al. |
| 2017/0141736 A1 | 5/2017 | Pratt et al. |
| 2017/0302183 A1 | 10/2017 | Young |
| 2017/0317913 A1 | 11/2017 | Kim et al. |
| 2017/0338773 A1 | 11/2017 | Balteanu et al. |
| 2018/0013465 A1 | 1/2018 | Chiron et al. |
| 2018/0048265 A1 | 2/2018 | Nentwig |
| 2018/0048276 A1 | 2/2018 | Khlat |
| 2018/0076772 A1 | 3/2018 | Khesbak et al. |
| 2018/0123453 A1 | 5/2018 | Puggelli et al. |
| 2018/0288697 A1 | 10/2018 | Camuffo et al. |
| 2018/0302042 A1 | 10/2018 | Zhang et al. |
| 2018/0309414 A1 | 10/2018 | Khlat et al. |
| 2018/0367101 A1 | 12/2018 | Chen et al. |
| 2019/0044480 A1 | 2/2019 | Khlat |
| 2019/0068234 A1 | 2/2019 | Khlat |
| 2019/0097277 A1 | 3/2019 | Fukae |
| 2019/0109566 A1 | 4/2019 | Folkmann et al. |
| 2019/0109613 A1 | 4/2019 | Khlat et al. |
| 2019/0222175 A1 | 7/2019 | Khlat et al. |
| 2019/0222178 A1 | 7/2019 | Khlat et al. |
| 2019/0267956 A1 | 8/2019 | Granger-Jones et al. |
| 2020/0007090 A1 | 1/2020 | Khlat et al. |
| 2020/0036337 A1 | 1/2020 | Khlat |
| 2020/0136561 A1 | 4/2020 | Khlat et al. |
| 2020/0136575 A1 | 4/2020 | Khlat et al. |
| 2020/0153394 A1 | 5/2020 | Khlat et al. |
| 2020/0177131 A1 | 6/2020 | Khlat |
| 2020/0204116 A1 | 6/2020 | Khlat |

(56) References Cited

U.S. PATENT DOCUMENTS

| | | |
|---|---|---|
| 2020/0228063 A1 | 7/2020 | Khlat |
| 2020/0259456 A1 | 8/2020 | Khlat |
| 2020/0259685 A1 | 8/2020 | Khlat |
| 2020/0266766 A1 | 8/2020 | Khlat et al. |

OTHER PUBLICATIONS

Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Notice of Allowance for U.S. Appl. No. 15/792,909, dated Dec. 19, 2018, 11 pages.
Notice of Allowance for U.S. Appl. No. 15/993,705, dated Oct. 31, 2018, 7 pages.
Pfister, Henry, "Discrete-Time Signal Processing," Lecture Note, pfister.ee.duke.edu/courses/ece485/dtsp.pdf, Mar. 3, 2017, 22 pages.
Non-Final Office Action for U.S. Appl. No. 15/888,260, dated May 2, 2019, 14 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Advisory Action for U.S. Appl. No. 15/888,300, dated Jun. 5, 2019, 3 pages.
Notice of Allowance for U.S. Appl. No. 15/984,566, dated May 21, 2019, 6 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.
Final Office Action for U.S. Appl. No. 15/986,948, dated Aug. 27, 2019, 9 pages.
Advisory Action for U.S. Appl. No. 15/986,948, dated Nov. 8, 2019, 3 pages.
Notice of Allowance for U.S. Appl. No. 15/986,948, dated Dec. 13, 2019, 7 pages.
Final Office Action for U.S. Appl. No. 16/018,426, dated Sep. 4, 2019, 12 pages.
Advisory Action for U.S. Appl. No. 16/018,426, dated Nov. 19, 2019, 3 pages.
Notice of Allowance for U.S. Appl. No. 16/180,887, dated Jan. 13, 2020, 8 pages.
Notice of Allowance for U.S. Appl. No. 16/155,127, dated Jun. 1, 2020, 8 pages.
Corrected Notice of Allowability for U.S. Appl. No. 15/888,300, dated May 13, 2020, 7 pages.
Non-Final Office Action for U.S. Appl. No. 16/246,859, dated Apr. 28, 2020, 9 pages.
Notice of Allowance for U.S. Appl. No. 16/354,234, dated Apr. 24, 2020, 9 pages.
Notice of Allowance for U.S. Appl. No. 16/122,611, dated Dec. 1, 2020, 9 pages.
Advisory Action for U.S. Appl. No. 16/174,535, dated Sep. 24, 2020, 3 pages.
Notice of Allowance for U.S. Appl. No. 16/174,535, dated Oct. 29, 2020, 7 pages.
Final Office Action for U.S. Appl. No. 16/284,023, dated Nov. 3, 2020, 7 pages.
Non-Final Office Action for U.S. Appl. No. 16/416,812, dated Oct. 16, 2020, 8 pages.
Non-Final Office Action for U.S. Appl. No. 16/514,051, dated Nov. 13, 2020, 9 pages.
Quayle Action for U.S. Appl. No. 16/589,940, dated Dec. 4, 2020, 8 pages.
U.S. Appl. No. 16/354,234, filed Mar. 15, 2019.
U.S. Appl. No. 16/246,859, filed Jan. 14, 2019.
U.S. Appl. No. 16/180,887, filed Nov. 5, 2018.
U.S. Appl. No. 16/514,051, filed Jul. 17, 2019.
U.S. Appl. No. 16/435,940, filed Jun. 10, 2019.
U.S. Appl. No. 16/589,940, filed Oct. 1, 2019.
Non-Final Office Action for U.S. Appl. No. 16/122,611, dated Mar. 11, 2020, 16 pages.
Notice of Allowance for U.S. Appl. No. 15/888,300, dated Jan. 14, 2020, 11 pages.
Corrected Notice of Allowability for U.S. Appl. No. 15/888,300, dated Feb. 25, 2020, 7 pages.
Notice of Allowance for U.S. Appl. No. 16/018,426, dated Mar. 31, 2020, 7 pages.
Non-Final Office Action for U.S. Appl. No. 16/174,535, dated Feb. 4, 2020, 7 pages.
Quayle Action for U.S. Appl. No. 16/354,234, dated Mar. 6, 2020, 8 pages.
Final Office Action for U.S. Appl. No. 16/122,611, dated Sep. 18, 2020, 17 pages.
Final Office Action for U.S. Appl. No. 16/174,535, dated Jul. 1, 2020, 7 pages.
Notice of Allowance for U.S. Appl. No. 16/246,859, dated Sep. 18, 2020, 8 pages.
Non-Final Office Action for U.S. Appl. No. 16/284,023, dated Jun. 24, 2020, 7 pages.
Quayle Action for U.S. Appl. No. 16/421,905, dated Aug. 25, 2020, 5 pages.
Non-Final Office Action for U.S. Appl. No. 16/435,940, dated Jul. 23, 2020, 6 pages.
Non-Final Office Action for U.S. Appl. No. 16/774,060, dated Aug. 17, 2020, 6 pages.
Notice of Allowance for U.S. Appl. No. 16/122,611, dated Jan. 13, 2021, 8 pages.
Notice of Allowance for U.S. Appl. No. 16/284,023, dated Jan. 19, 2021, 7 pages.
Notice of Allowance for U.S. Appl. No. 16/416,812, dated Feb. 16, 2021, 8 pages.
Non-Final Office Action for U.S. Appl. No. 16/689,236 dated Mar. 2, 2021, 15 pages.
Notice of Allowance for U.S. Appl. No. 16/435,940, dated Dec. 21, 2020, 7 pages.
Notice of Allowance for U.S. Appl. No. 16/774,060, dated Feb. 3, 2021, 7 pages.
Notice of Allowance for U.S. Appl. No. 16/661,061, dated Feb. 10, 2021, 7 pages.
Notice of Allowance for U.S. Appl. No. 16/122,611, dated Apr. 1, 2021, 8 pages.
Non-Final Office Action for U.S. Appl. No. 16/582,471, dated Mar. 24, 2021, 11 pages.

* cited by examiner

US 11,018,627 B2

MULTI-BANDWIDTH ENVELOPE TRACKING INTEGRATED CIRCUIT AND RELATED APPARATUS

RELATED APPLICATIONS

This application claims the benefit of provisional patent application Ser. No. 62/835,226, filed Apr. 17, 2019, the disclosure of which is hereby incorporated herein by reference in its entirety.

FIELD OF THE DISCLOSURE

The technology of the disclosure relates generally to an envelope tracking (ET) radio frequency (RF) power amplifier apparatus.

BACKGROUND

Mobile communication devices, such as smartphones, have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience has also led to the rise of so-called wearable devices, such as smartwatches. Over time, these wearable devices have evolved from simple companion devices to mobile communication devices into full-fledged multi-functional wireless communication devices. Nowadays, most wearable electronic devices are often equipped with digital and analog circuitries capable of communicating a radio frequency (RF) signal(s) in a variety of wireless communication systems, such as long-term evolution (LTE), Wi-Fi, Bluetooth, and so on. Like mobile communication devices, wearable devices often employ sophisticated power amplifiers to amplify RF signal(s) to help improve coverage range, data throughput, and reliability of the wearable devices.

Envelope tracking (ET) is a power management technology designed to improve efficiency levels of power amplifiers. In this regard, it may be desirable to employ ET across a variety of wireless communication technologies to help reduce power consumption and thermal dissipation in wearable devices. Notably, the RF signal(s) communicated in different wireless communication systems may correspond to different modulation bandwidths (e.g., from 80 KHz to over 40 MHz). As such, it may be further desirable to ensure that the power amplifiers can maintain optimal efficiency across a wide range of modulation bandwidth.

SUMMARY

Embodiments of the disclosure relate to a multi-bandwidth envelope tracking (ET) integrated circuit (IC) (ETIC) and related apparatus. In a non-limiting example, the multi-bandwidth ETIC is coupled to an amplifier circuit(s) configured to amplify a radio frequency (RF) signal corresponding to a wide range of modulation bandwidth (e.g., from less than 90 KHz to over 40 MHz). In this regard, the multi-bandwidth ETIC is configured to generate different ET voltages based on the modulation bandwidth of the RF signal. By generating the ET voltages based on the modulation bandwidth of the RF signal, it may be possible to optimize operating efficiency of the amplifier circuit(s). As a result, it may be possible to improve power consumption and reduce heat dissipation in an apparatus employing the multi-bandwidth ETIC, thus making it possible to provide the multi-bandwidth ETIC in a wearable device.

In one aspect, a multi-bandwidth ETIC is provided. The multi-bandwidth ETIC includes an output port coupled to an amplifier circuit configured to amplify an RF signal based on a modulated voltage. The multi-bandwidth ETIC also includes a first ET voltage circuit configured to generate a first ET voltage corresponding to a first modulation bandwidth. The multi-bandwidth ETIC also includes a second ET voltage circuit configured to generate a second ET voltage corresponding to a second modulation bandwidth lower than the first modulation bandwidth. The multi-bandwidth ETIC also includes a control circuit. The control circuit is configured to activate the first ET voltage circuit and deactivate the second ET voltage circuit to provide the first ET voltage to the output port as the modulated voltage in response to the RF signal being modulated in the first modulation bandwidth. The control circuit is also configured to activate the second ET voltage circuit and deactivate the first ET voltage circuit to provide the second ET voltage to the output port as the modulated voltage in response to the RF signal being modulated in the second modulation bandwidth.

In another aspect, an ET apparatus is provided. The ET apparatus includes an amplifier circuit configured to amplify an RF signal based on a modulated voltage. The ET apparatus also includes a multi-bandwidth ETIC. The multi-bandwidth ETIC includes an output port coupled to the amplifier circuit.

The multi-bandwidth ETIC also includes a first ET voltage circuit configured to generate a first ET voltage corresponding to a first modulation bandwidth. The multi-bandwidth ETIC also includes a second ET voltage circuit configured to generate a second ET voltage corresponding to a second modulation bandwidth lower than the first modulation bandwidth. The multi-bandwidth ETIC also includes a control circuit. The control circuit is configured to activate the first ET voltage circuit and deactivate the second ET voltage circuit to provide the first ET voltage to the output port as the modulated voltage in response to the RF signal being modulated in the first modulation bandwidth. The control circuit is also configured to activate the second ET voltage circuit and deactivate the first ET voltage circuit to provide the second ET voltage to the output port as the modulated voltage in response to the RF signal being modulated in the second modulation bandwidth.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
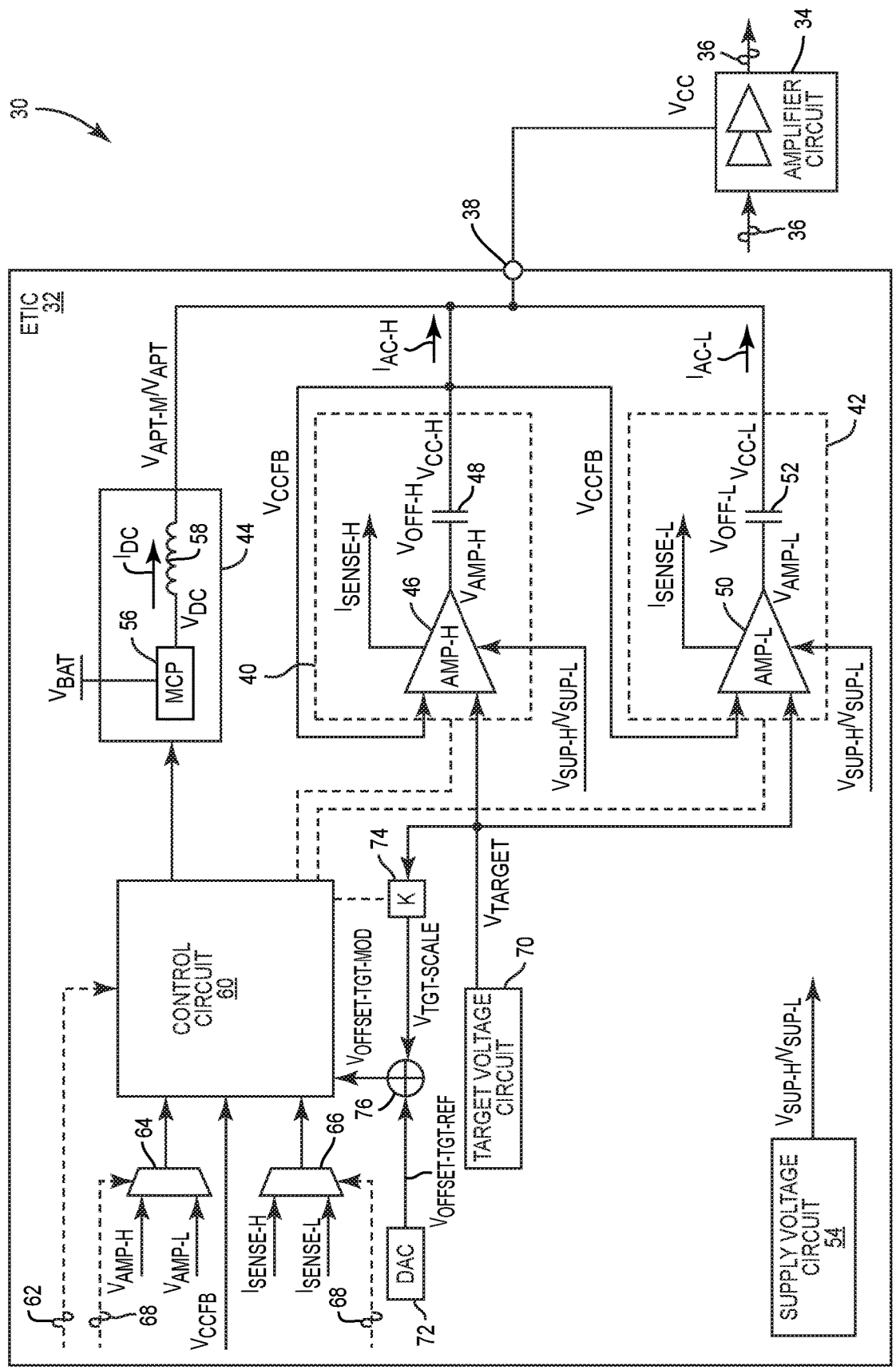
Figure 3:
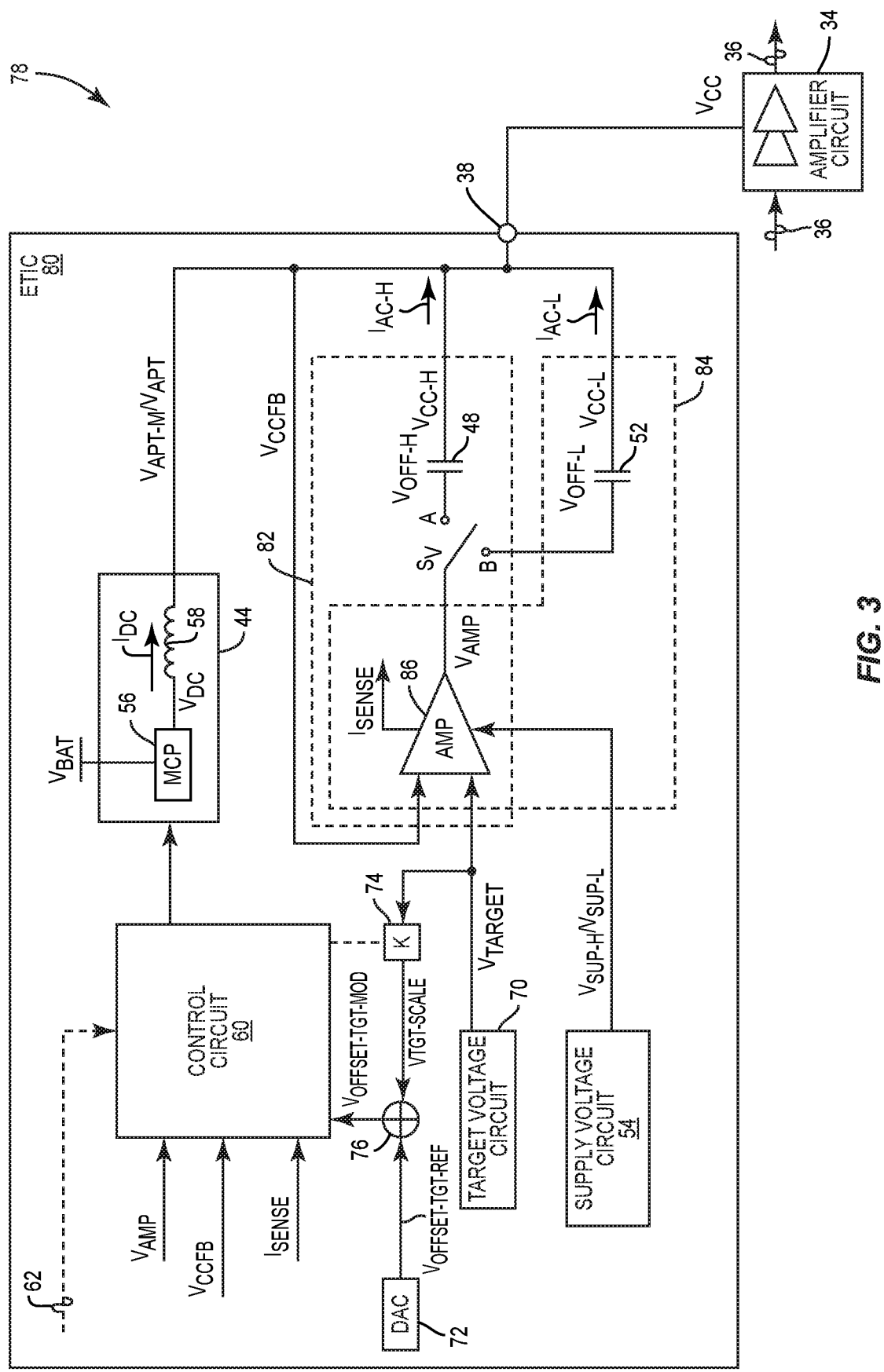

FIG. 1 is a schematic diagram of an exemplary orthogonal frequency division multiplexing (OFDM) time-frequency grid illustrating at least one resource block (RB);

FIG. 2 is a schematic diagram of an exemplary envelope tracking (ET) apparatus configured according to an embodiment of the present disclosure to incorporate a multi-bandwidth ET integrated circuit (ETIC) for improving operating efficiency of an amplifier circuit across a wide range of modulation bandwidth; and FIG. 3 is a schematic diagram of an exemplary ET apparatus configured according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-bandwidth envelope tracking (ET) integrated circuit (IC) (ETIC) and related apparatus. In a non-limiting example, the multi-bandwidth ETIC is coupled to an amplifier circuit(s) configured to amplify a radio frequency (RF) signal corresponding to a wide range of modulation bandwidth (e.g., from less than 90 KHz to over 40 MHz). In this regard, the multi-bandwidth ETIC is configured to generate different ET voltages based on the modulation bandwidth of the RF signal. By generating the ET voltages based on the modulation bandwidth of the RF signal, it may be possible to optimize operating efficiency of the amplifier circuit(s). As a result, it may be possible to improve power consumption and reduce heat dissipation in an apparatus employing the multi-bandwidth ETIC, thus making it possible to provide the multi-bandwidth ETIC in a wearable device.

Before discussing the multi-bandwidth ETIC of the present disclosure, a brief overview of a resource block (RB)-based resource allocation scheme is first provided with reference FIG. 1 to help understand the relationship between a modulation bandwidth of an RF signal and a number of RBs allocated to the RF signal. The discussion of specific exemplary aspects of a multi-bandwidth ETIC of the present disclosure starts below with reference to FIG. 2.

In this regard, FIG. 1 is a schematic diagram of an exemplary orthogonal frequency division multiplexing (OFDM) time-frequency grid 10 illustrating at least one RB 12. The OFDM time-frequency grid 10 includes a frequency axis 14 and a time axis 16. Along the frequency axis 14, there are a number of subcarriers 18(1)-18(M). The subcarriers 18(1)-18(M) are orthogonally separated from each other by a frequency spacing $\Delta f$ of 15 KHz.

Along the time axis 16, there are a number of OFDM symbols 20(1)-20(N). Each intersection of the subcarriers 18(1)-18M) and the OFDM symbols 20(1)-20(N) defines a resource element (RE) 21.

In one example, the RB 12 includes twelve (12) consecutive subcarriers among the subcarriers 18(1)-18(M), and seven (7) consecutive OFDM symbols among the OFDM symbols 20(1)-20(N). In this regard, the RB 12 includes eighty-four (84) of the REs 21 (12 subcarriers×7 OFDM symbols). The RB 12 has an RB duration 22, which equals one-half millisecond (0.5 ms), along the time axis 16. Accordingly, the RB 12 has a bandwidth 24, which equals 180 KHz (15 KHz/subcarrier×12 subcarriers), along the frequency axis 14. In OFDM-based communication systems such as long-term evolution (LTE), the RB 12 is the minimum unit for allocating resources to users.

In an LTE system, an RF signal 26 can occupy multiple subcarriers among the subcarriers 18(1)-18(N). In this regard, a signal bandwidth 28 of the RF signal 26 is a function of the number of RBs 12 contained in the RF signal 26 along the frequency axis 14. In this regard, if the RF signal 26 contains ten (10) RBs 12, then the signal bandwidth 28 will be 1.8 MHz (180 KHz/RB×10 RBs). If the RF signal 26 contains twenty-five (25) RBs 12, then the signal bandwidth 28 will be 4.5 MHz (180 KHz/RB×25 RBs). If the RF signal 26 contains two hundred (200) RBs 12, then the signal bandwidth 28 will be 36 MHz (180 KHz/RB×200 RBs). In this regard, the more RBs 12 the RF signal 26 contains, the wider the signal bandwidth 28 will be, and the more subcarriers among the subcarriers 18(1)-18(M) are modulated within the RB duration 22. As such, the RF signal 26 can exhibit more and faster amplitude variations within the RB duration 22 when the RF signal 26 is modulated according to a selected modulation and coding scheme (MCS). As a result, when the RF signal 26 is amplified for transmission over a wireless medium, an ET amplifier circuit would need to operate fast enough to keep up with the faster amplitude variations of the RF signal 26 across the signal bandwidth 28 within the RB duration 22.

FIG. 2 is a schematic diagram of an exemplary ET apparatus 30 configured according to an embodiment of the present disclosure to incorporate a multi-bandwidth ETIC 32 for improving operating efficiency of an amplifier circuit 34 across a wide range of modulation bandwidth. The amplifier circuit 34 is configured to amplify an RF signal 36 based on a modulated voltage $V_{CC}$ and the multi-bandwidth ETIC 32 is configured to generate the modulated voltage $V_{CC}$ based on modulation bandwidth of the RF signal 36. In examples discussed herein, the multi-bandwidth ETIC 32 can be configured to generate a first ET voltage $V_{CC-H}$ when the RF signal 36 corresponds to a first modulation bandwidth (e.g., greater than 180 KHz or 1 RB) or a second ET voltage $V_{CC-L}$ ($V_{CC-L} < V_{CC-H}$) when the RF signal 36 corresponds to a second modulation bandwidth (e.g., approximately equals 180 KHz or 1 RB). In addition, the multi-bandwidth ETIC 32 can be further configured to generate a modulated average power tracking (APT) voltage $V_{APT-M}$ when the RF signal 36 corresponds to a third modulation bandwidth (e.g., lesser than 90 KHz or ½ RB). The multi-bandwidth ETIC 32 may be further configured to generate an APT voltage $V_{APT}$ regardless of the modulation bandwidth of the RF signal 36. Accordingly, the amplifier circuit 34 may receive the first ET voltage $V_{CC-H}$, the second ET voltage $V_{CC-L}$, the modulated APT voltage $V_{APT-M}$, or the APT voltage $V_{APT}$ as the modulated voltage $V_{CC}$ for amplifying the RF signal 36. As such, it may be possible to keep the amplifier circuit 34 in a higher operating efficiency across a wide range of modulation bandwidth. As a result, it may be possible to improve power consumption and heat dissipation of the ET apparatus 30, thus making it possible to provide the ET apparatus 30 in a wearable device.

The multi-bandwidth ETIC 32 includes an output port 38 coupled to the amplifier circuit 34. The output port 38 is configured to selectively output one of the first ET voltage $V_{CC-H}$, the second ET voltage $V_{CC-L}$, the modulated APT voltage $V_{APTM}$, and the APT voltage $V_{APT}$ as the modulated voltage $V_{CC}$ to the amplifier circuit 34 for amplifying the RF signal 36.

The multi-bandwidth ETIC 32 includes a first ET voltage circuit 40 and a second ET voltage circuit 42 configured to generate the first ET voltage $V_{CC-H}$ and the second ET voltage $V_{CC-L}$ at the output port 38, respectively. The multi-bandwidth ETIC 32 includes a tracker circuit 44 configured to generate the modulate APT voltage $V_{APTM}$ and the APT voltage $V_{APT}$.

In a non-limiting example, the first ET voltage circuit 40 includes a first voltage amplifier 46 (denoted as "AMP-H") and a first offset capacitor 48, and the second ET voltage circuit 42 includes a second voltage amplifier 50 (denoted as "AMP-L") and a second offset capacitor 52. The first voltage amplifier 46 is configured to generate a first initial ET voltage $V_{AMP-H}$ based on an ET target voltage $V_{TARGET}$ and a feedback voltage $V_{CCFB}$. The first offset capacitor 48 is coupled between the first voltage amplifier 46 and the output port 38. The first offset capacitor 48 is configured to raise the first initial ET voltage $V_{AMP-H}$ by a first offset voltage $V_{OFF-H}$ to generate the first ET voltage $V_{CC-H}$ ($V_{CC-H} = V_{AMP-H} + V_{OFF-H}$) at the output port 38. In a non-limiting example, the feedback voltage $V_{CCFB}$ is proportional to the first ET voltage $V_{CC-H}$ when the first ET voltage circuit 40 is activated to generate the first ET voltage $V_{CC-H}$ at the output port 38.

The second voltage amplifier 50 is configured to generate a second initial ET voltage $V_{AMP-L}$ based on the ET target voltage $V_{TARGET}$ and the feedback voltage $V_{CCFB}$. The second offset capacitor 52 is coupled between the second voltage amplifier 50 and the output port 38. The second offset capacitor 52 is configured to raise the second initial ET voltage $V_{AMP-L}$ by a second offset voltage $V_{OFF-L}$ to generate the second ET voltage $V_{CC-L}$ ($V_{CC-L} = V_{AMP-L} + V_{OFF-L}$) at the output port 38. In a non-limiting example, the feedback voltage $V_{CCFB}$ is proportional to the second ET voltage $V_{CC-L}$ when the second ET voltage circuit 42 is activated to generate the second ET voltage $V_{CC-L}$ at the output port 38.

The first offset capacitor 48 is chosen to have a first capacitance and the second offset capacitor 52 is chosen to have a second capacitance substantially smaller than the first capacitance. Notably, the second capacitance is said to be substantially smaller than the first capacitance when the second capacitance is less than one-thirtieth (1/30) of the first capacitance. In a non-limiting example, the first capacitance can be approximately 2.2 microFarad (g) and the second capacitance can be approximately 31 nanoFarad (nF). It should be appreciated that the first capacitance and the second capacitance can also be any other suitable values.

Each of the first voltage amplifier 46 and the second voltage amplifier 50 is configured to operate based on a first supply voltage $V_{SUP-H}$ or a second supply voltage $V_{SUP-L}$ which is lower than the first supply voltage $V_{SUP-H}$. In a non-limiting example, the multi-bandwidth ETIC 32 includes a supply voltage circuit 54 configured to generate the first supply voltage $V_{SUP-H}$ and the second supply voltage $V_{SUP-L}$.

The tracker circuit 44 may include a multi-level charge pump (MCP) 56 configured to generate a low-frequency voltage $V_{DC}$ based on a battery voltage $V_{BAT}$. The tracker circuit 44 also includes a power inductor 58 coupled between the MCP 56 and the output port 38. The power inductor 58 is configured to induce a low-frequency current $I_{DC}$ (e.g., a direct current) at the output port 38 based on the low-frequency voltage $V_{DC}$.

The multi-bandwidth ETIC 32 includes a control circuit 60, which can be provided as a microprocessor, a microcontroller, or a field-programmable gate array (FPGA), as an example. The control circuit 60 may be coupled to the first ET voltage circuit 40, the second ET voltage circuit 42, the tracker circuit 44, and/or the supply voltage circuit 54. As discussed in detail below, the control circuit 60 can be configured to control the first ET voltage circuit 40, the second ET voltage circuit 42, and the tracker circuit 44 to output the first ET voltage $V_{CC-H}$, the second ET voltage $V_{CC-L}$, the modulated APT voltage $V_{APT-M}$, or the APT voltage $V_{APT}$ at the output port 38 based on the modulation bandwidth of the RF signal 36.

The control circuit 60 may receive a bandwidth indication signal 62 (e.g., from a transceiver circuit) that is indicative of the modulation bandwidth of the RF signal 36. In one example, the control circuit 60 activates the first ET voltage circuit 40 and deactivates the second ET voltage circuit 42 to provide the first ET voltage $V_{CC-H}$ to the amplifier circuit 34 as the modulated voltage $V_{CC}$ when the RF signal 36 is modulated in the first modulation bandwidth. In another example, the control circuit 60 deactivates the first ET voltage circuit 40 and activates the second ET voltage circuit 42 to provide the second ET voltage $V_{CC-L}$ to the amplifier circuit 34 as the modulated voltage $V_{CC}$ when the RF signal 36 is modulated in the second modulation bandwidth.

In another example, the control circuit 60 deactivates the first ET voltage circuit 40 and the second ET voltage circuit 42 and causes the tracker circuit 44 to generate the low-frequency voltage $V_{DC}$ as the modulated APT voltage $V_{APT-M}$ when the RF signal 36 is modulated in the third modulation bandwidth. Accordingly, the amplifier circuit 34 receives the modulated APT voltage $V_{APT-M}$ as the modulated voltage $V_{CC}$.

In another example, the control circuit 60 deactivates the first ET voltage circuit 40 and the second ET voltage circuit 42 and causes the tracker circuit 44 to generate the low-frequency voltage $V_{DC}$ as the APT voltage $V_{APT}$ when the amplifier circuit 34 is only configured to amplify the RF signal 36 based on the APT voltage $V_{APT}$. Accordingly, the amplifier circuit 34 receives the APT voltage $V_{APT}$ as the modulated voltage $V_{CC}$. Furthermore, the control circuit 60 is further configured to cause the tracker circuit 44 to provide the low-frequency current $I_{DC}$ to the amplifier circuit 34 via the output port 38.

In addition to generating the first ET voltage $V_{CC-H}$, the first voltage amplifier 46 may be configured to source a first high-frequency current $I_{AC-H}$ (e.g., an alternating current) at the output port 38. Similarly, the second voltage amplifier 50 may be configured to source a second high-frequency current $I_{AC-L}$ (e.g., an alternating current) at the output port 38. In this regard, the first voltage amplifier 46 may be configured to generate a first sense current $I_{SENSE-H}$ to indicate an amount of the first high-frequency current $I_{AC-H}$ being sourced by the first voltage amplifier 46. Likewise, the second voltage amplifier 50 may be configured to generate a second sense current $I_{SENSE-L}$ to indicate an amount of the second high-frequency current $I_{AC-L}$ being sourced by the second voltage amplifier 50.

The multi-bandwidth ETIC 32 may include a first multiplexer 64 and a second multiplexer 66. The first multiplexer 64 may be configured based on a selection signal 68 to selectively provide one of the first initial ET voltage $V_{AMP-H}$ and the second initial ET voltage $V_{AMP-L}$ to the control circuit 60. The second multiplexer 66 may be configured based on the selection signal 68 to selectively provide one of the first sense current $I_{SENSE-H}$ and the second sense current $I_{SENSE-L}$ to the control circuit 60. In a non-limiting example, the selection signal 68 can be provided by the transceiver circuit, the control circuit 60, or any other control circuit. More specifically, when the first voltage amplifier 46 is activated and the second voltage amplifier 50 is deactivated, the selection signal 68 causes the first multiplexer 64 and the second multiplexer 66 to provide the first initial ET voltage $V_{AMP-H}$ and the first sense current $I_{SENSE-H}$ to the control circuit 60. In contrast, when the first voltage amplifier 46 is deactivated and the second voltage amplifier 50 is activated, the selection signal 68 causes the first multiplexer 64 and the second multiplexer 66 to provide the second initial ET voltage $V_{AMP-L}$ and the second sense current $I_{SENSE-L}$ to the control circuit 60.

The multi-bandwidth ETIC 32 may include a target voltage circuit 70 configured to generate the ET target voltage $V_{TARGET}$ for the first voltage amplifier 46 and the second voltage amplifier 50. The multi-bandwidth ETIC 32 may also include a digital-to-analog converter (DAC) 72 configured to generate a reference target offset voltage $V_{OFFSET-TGT-REF}$, which may be a constant voltage. The multi-bandwidth ETIC 32 may include a voltage scaler 74 and a voltage combiner 76. The voltage scaler 74 may be configured to scale the ET target voltage $V_{TARGET}$ based on a predefined scaling factor K ($0 \leq K \leq 1$) to generate a scaled ET target voltage $V_{TGT-SCALE}$. The voltage combiner 76 is configured to combine the reference target offset voltage $V_{OFFSET-TGT-REF}$ with the scaled ET target voltage $V_{TGT-SCALE}$ to generate a modulated target offset voltage $V_{OFFSET-TGT-MOD}$.

In one non-limiting example, when the control circuit 60 determines that the RF signal 36 corresponds to the first modulation bandwidth (e.g., >180 KHz or 1 RB), the control circuit 60 activates the first voltage amplifier 46 and deactivates the second voltage amplifier 50 and sets the scaling factor K to zero (0). As a result, the modulated target offset voltage $V_{OFFSET-TGT-MOD}$ equals the reference target offset voltage $V_{OFFSET-TGT-REF}$. Concurrently or subsequently, the first multiplexer 64 and the second multiplexer 66 may be controlled via the selection signal 68 to provide the first initial ET voltage $V_{AMP-H}$ and the first sense current $I_{SENSE-H}$ to the control circuit 60. The control circuit 60 may also control the supply voltage circuit 54 to provide the first supply voltage $V_{SUP-H}$ to the first voltage amplifier 46. The modulated target offset voltage $V_{OFFSET-TGT-MOD}$ and the first supply voltage $V_{SUP-H}$ may be expressed in equations (Eq. 1 and Eq. 2) below.

$$V_{OFFSET-TGT-MOD} = V_{OFFSET-TGT-REF} = V_{CC-MIN} - N_{headroom} \quad \text{(Eq. 1)}$$

$$V_{SUP-H} = (V_{CC-MAX} - V_{CC-MIN}) + N_{headroom} + P_{headroom} \quad \text{(Eq. 2)}$$

In Eq. 1 and Eq. 2 above, $V_{CC-MAX}$ and $V_{CC-MIN}$ represent a maximum (e.g., a peak voltage) and a minimum (e.g., a bottom voltage) of the modulated voltage $V_{CC}$, respectively. $N_{headroom}$ and $P_{headroom}$ represent voltage headrooms to $V_{CC-MAX}$ and $V_{CC-MIN}$, respectively.

In another non-limiting example, when the control circuit 60 determines that the RF signal 36 corresponds to the second modulation bandwidth (e.g., $\approx$180 KHz or 1 RB), the control circuit 60 deactivates the first voltage amplifier 46 and activates the second voltage amplifier 50 and sets the scaling factor K to be between zero (0) and one (1) ($0 < K < 1$). Concurrently or subsequently, the first multiplexer 64 and the second multiplexer 66 may be controlled via the selection signal 68 to provide the second initial ET voltage $V_{AMP-L}$ and the second sense current $I_{SENSE-L}$ to the control circuit 60. The control circuit 60 may also control the supply voltage circuit 54 to provide the second supply voltage $V_{SUP-L}$ to the second voltage amplifier 50. The modulated target offset voltage $V_{OFFSET-TGT-MOD}$ and the second supply voltage $V_{SUP-L}$ may be expressed in equations (Eq. 3 and Eq. 4) below.

$$V_{OFFSET-TGT-MOD} = V_{CC-MIN} - N_{headroom} + K^*(V_{CC} - V_{CC-MIN}) \quad \text{(Eq. 3)}$$

$$V_{SUP-L} = (1-K)^*(V_{CC-MAX} - V_{CC-MIN}) + N_{headroom} + P_{headroom} \quad \text{(Eq. 4)}$$

By comparing Eq. 2 and Eq. 4, it can be seen that the second supply voltage $V_{SUP-L}$ is lower than the first supply voltage $V_{SUP-H}$ due to the scaling factor K. As an example, if K=0.5 then the second supply voltage $V_{SUP-L}$ is almost one-half (½) of the first supply voltage $V_{SUP-H}$. Accordingly, the second voltage amplifier 50 may generate the second initial ET voltage $V_{AMP-L}$ at almost ½ of the first initial ET voltage $V_{AMP-H}$, and the second offset capacitor 52 may be modulated to provide the second offset voltage $V_{OFF-L}$ that is almost ½ of the first offset voltage $V_{OFF-H}$. As such, the second capacitance of the second offset capacitor 52 can be configured to be substantially less than the first capacitance of the first offset capacitor 48. As a result, the second voltage amplifier 50 may operate with an improved efficiency when the RF signal 36 is modulated in the second modulation bandwidth.

In another non-limiting example, when the control circuit 60 determines that the RF signal 36 corresponds to the third modulation bandwidth (e.g., 90 KHz or ½ RB), the control circuit 60 deactivates the first voltage amplifier 46 and the second voltage amplifier 50 and sets the scaling factor K to one (1). As a result, the modulated target offset voltage $V_{OFFSET-TGT-MOD}$ equals a sum of the reference target offset voltage $V_{OFFSET-TGT-REF}$ and the ET target voltage $V_{TARGET}$ ($V_{OFFSET-TGT-MOD}=V_{OFFSET-TGT-REF}+V_{TARGET}$). The first multiplexer 64, the second multiplexer 66, and the supply voltage circuit 54 are also disabled. Accordingly, the tracker circuit 44 can be configured to generate the low-frequency voltage $V_{DC}$ based on the modulated target offset voltage $V_{OFFSET-TGT-MOD}$. As a result, the MCP 56 generates the low-frequency voltage $V_{DC}$ as the modulated APT voltage $V_{APT-M}$.

The bandwidth of the modulated APT voltage $V_{APT-M}$ may depend on the power inductor 58 as well as the first offset capacitor 48 or the second offset capacitor 52, as shown in the equation (Eq. 5) below.

$$V_{APT-M} \text{ Bandwidth} = \frac{1}{2\pi\sqrt{LC}} \quad (\text{Eq. 5})$$

In Eq. 5 above, L represents an inductance of the power inductor 58. C represents either the first capacitance of the first offset capacitor 48 or the second capacitance of the second offset capacitor 52. In one example, the control circuit 60 may disable (e.g., bypass) the second offset capacitor 52. Accordingly, the bandwidth of the modulated APT voltage $V_{APT-M}$ will depend on the inductance of the power inductor 58 and the first capacitance of the first offset capacitor 48. For example, if the inductance of the power inductor 58 equals 2 nanoHenry (nH) and the first capacitance of the first offset capacitor 48 equals 2 µF, then the bandwidth of the modulated APT voltage $V_{APT-M}$ would be approximately 79.6 KHz according to Eq. 5.

In another example, the control circuit 60 may disable (e.g., bypass) the first offset capacitor 48. Accordingly, the bandwidth of the modulated APT voltage $V_{APT-M}$ will depend on the second capacitance of the second offset capacitor 52. As discussed above, the second capacitance of the second offset capacitor 52 may be substantially smaller than the first capacitance of the first offset capacitor 48. As such, the bandwidth of the modulated APT voltage $V_{APT-M}$ can be higher when the control circuit 60 deactivates the first offset capacitor 48.

In another non-limiting example, the control circuit 60 may determine (e.g., based on the bandwidth indication signal 62) that it may be desirable for the amplifier circuit 34 to amplify the RF signal 36 based on the APT voltage $V_{APT}$. In this regard, the control circuit 60 deactivates the first voltage amplifier 46 and the second voltage amplifier 50 and sets the scaling factor K to zero (0). As a result, the modulated target offset voltage $V_{OFFSET-TGT-MOD}$ equals the reference target offset voltage $V_{OFFSET-TGT-REF}$. The first multiplexer 64, the second multiplexer 66, and the supply voltage circuit 54 are also disabled. Accordingly, the tracker circuit 44 can be configured to generate the low-frequency voltage $V_{DC}$ based on the reference target offset voltage $V_{OFFSET-TGT-REF}$ (e.g., a constant voltage). As such, the MCP 56 generates the low-frequency voltage $V_{DC}$ as the APT voltage $V_{APT}$, which is also a constant voltage.

Alternative to employing the first voltage amplifier 46 and the second voltage amplifier 50 in the first ET voltage circuit 40 and the second ET voltage circuit 42, respectively, it may be possible to share a single voltage amplifier between the first ET voltage circuit 40 and the second ET voltage circuit 42. In this regard, FIG. 3 is a schematic diagram of an exemplary ET apparatus 78 configured according to another embodiment of the present disclosure. Common elements between FIGS. 2 and 3 are shown therein with common element numbers and will not be re-described herein.

The ET apparatus 78 includes a multi-bandwidth ETIC 80. The multi-bandwidth ETIC 80 includes a first ET voltage circuit 82 and a second ET voltage circuit 84 configured to share a voltage amplifier 86. The multi-bandwidth ETIC 80 may include a switch $S_v$ configured to alternately couple the voltage amplifier 86 to the first offset capacitor 48 or the second offset capacitor 52.

In one non-limiting example, when the control circuit 60 determines that the RF signal 36 corresponds to the first modulation bandwidth (e.g., >180 KHz or 1 RB), the control circuit 60 activates the first ET voltage circuit 82 by coupling the voltage amplifier 86 to the first offset capacitor 48. The control circuit 60 may also control the supply voltage circuit 54 to provide the first supply voltage $V_{SUP-H}$, as shown in Eq. 2, to the voltage amplifier 86. Accordingly, the voltage amplifier 86 generates an initial ET voltage $V_{AMP}$ based on the ET target voltage $V_{TARGET}$ and the first supply voltage $V_{SUP-H}$. The first offset capacitor 48 raises the initial ET voltage $V_{AMP}$ by the first offset voltage $V_{OFF-H}$ to generate the first ET voltage $V_{CC-H}$ at the output port 38. Similar to the first voltage amplifier 46 in FIG. 2, the voltage amplifier 86 may be configured to source the first high-frequency current $I_{AC-H}$ and generate a sense current $I_{SENSE}$ proportional to the first high-frequency current $I_{AC-H}$.

In another non-limiting example, when the control circuit 60 determines that the RF signal 36 corresponds to the second modulation bandwidth (e.g., 180 KHz or 1 RB), the control circuit 60 activates the second ET voltage circuit 84 by coupling the voltage amplifier 86 to the second offset capacitor 52. The control circuit 60 may also control the supply voltage circuit 54 to provide the second supply voltage $V_{SUP-L}$, as shown in Eq. 4, to the voltage amplifier 86. Accordingly, the voltage amplifier 86 generates the initial ET voltage $V_{AMP}$ based on the ET target voltage $V_{TARGET}$ and the second supply voltage $V_{SUP-L}$. The second offset capacitor 52 raises the initial ET voltage $V_{AMP}$ by the second offset voltage $V_{OFF-L}$ to generate the second ET voltage $V_{CC-L}$ at the output port 38. Similar to the second voltage amplifier 50 in FIG. 2, the voltage amplifier 86 may be configured to source the second high-frequency current $I_{AC-L}$ and generate the sense current $I_{SENSE}$ proportional to the second high-frequency current $I_{AC-L}$.

Given that the first ET voltage circuit 82 and the second ET voltage circuit 84 share the voltage amplifier 86, it may be possible to eliminate the first multiplexer 64 and the second multiplexer 66 from the multi-bandwidth ETIC 80. As a result, the control circuit 60 can be configured to receive the initial ET voltage $V_{AMP}$, the sense current $I_{SENSE}$, and the feedback voltage $V_{CCFB}$.

Those skilled in the art will recognize improvements and modifications to the preferred embodiments of the present disclosure. All such improvements and modifications are considered within the scope of the concepts disclosed herein and the claims that follow.

What is claimed is:

1. A multi-bandwidth envelope tracking (ET) integrated circuit (IC) (ETIC) comprising:
    an output port coupled to an amplifier circuit configured to amplify a radio frequency (RF) signal based on a modulated voltage;
    a first ET voltage circuit configured to generate a first ET voltage corresponding to a first modulation bandwidth;
    a second ET voltage circuit configured to generate a second ET voltage corresponding to a second modulation bandwidth lower than the first modulation bandwidth; and
    a control circuit configured to:
        activate the first ET voltage circuit and deactivate the second ET voltage circuit to provide the first ET voltage to the output port as the modulated voltage in response to the RF signal being modulated in the first modulation bandwidth; and
        activate the second ET voltage circuit and deactivate the first ET voltage circuit to provide the second ET voltage to the output port as the modulated voltage in response to the RF signal being modulated in the second modulation bandwidth.

2. The multi-bandwidth ETIC of claim 1 wherein:
    the first ET voltage circuit comprises:
        a first voltage amplifier configured to generate a first initial ET voltage and source a first high-frequency current based on an ET target voltage and a first supply voltage; and
        a first offset capacitor having a first capacitance and configured to raise the first initial ET voltage by a first offset voltage to generate the first ET voltage; and
    the second ET voltage circuit comprises:
        a second voltage amplifier configured to generate a second initial ET voltage and source a second high-frequency current based on the ET target voltage and a second supply voltage; and
        a second offset capacitor having a second capacitance and configured to raise the second initial ET voltage by a second offset voltage to generate the second ET voltage.

3. The multi-bandwidth ETIC of claim 2 wherein the second capacitance is substantially smaller than the first capacitance.

4. The multi-bandwidth ETIC of claim 2 wherein the second supply voltage is lower than the first supply voltage.

5. The multi-bandwidth ETIC of claim 2 further comprising a tracker circuit comprising:
    a multi-level charge pump (MCP) configured to generate a low-frequency voltage; and
    a power inductor configured to induce a low-frequency current based on the low-frequency voltage.

6. The multi-bandwidth ETIC of claim 5 wherein the control circuit is further configured to modulate the low-frequency voltage based on a scaled ET target voltage lower than the ET target voltage when the control circuit activates the second ET voltage circuit and deactivates the first ET voltage circuit.

7. The multi-bandwidth ETIC of claim 6 further comprising a voltage scaler configured to scale the ET target voltage by a predefined scaling factor to generate the scaled ET target voltage.

8. The multi-bandwidth ETIC of claim 6 wherein the control circuit is further configured to modulate the low-frequency voltage based on a feedback of the second initial ET voltage and a feedback of the second high-frequency current.

9. The multi-bandwidth ETIC of claim 1 wherein:
    the first ET voltage circuit comprises:
        a voltage amplifier configured to generate an initial ET voltage and source a first high-frequency current based on an ET target voltage and a first supply voltage; and
        a first offset capacitor having a first capacitance and configured to raise the initial ET voltage by a first offset voltage to generate the first ET voltage; and
    the second ET voltage circuit comprises:
        the voltage amplifier configured to generate the initial ET voltage and source a second high-frequency current based on the ET target voltage and a second supply voltage; and
        a second offset capacitor having a second capacitance and configured to raise the initial ET voltage by a second offset voltage to generate the second ET voltage.

10. The multi-bandwidth ETIC of claim 9 wherein the control circuit is further configured to:
    activate the first ET voltage circuit by coupling the voltage amplifier to the first offset capacitor in response to the RF signal being modulated in the first modulation bandwidth; and
    activate the second ET voltage circuit by coupling the voltage amplifier to the second offset capacitor in response to the RF signal being modulated in the second modulation bandwidth.

11. An envelope tracking (ET) apparatus comprising:
    an amplifier circuit configured to amplify a radio frequency (RF) signal based on a modulated voltage; and
    a multi-bandwidth ET integrated circuit (ETIC) comprising:
        an output port coupled to the amplifier circuit;
        a first ET voltage circuit configured to generate a first ET voltage corresponding to a first modulation bandwidth;
        a second ET voltage circuit configured to generate a second ET voltage corresponding to a second modulation bandwidth lower than the first modulation bandwidth; and
        a control circuit configured to:
            activate the first ET voltage circuit and deactivate the second ET voltage circuit to provide the first ET voltage to the output port as the modulated voltage in response to the RF signal being modulated in the first modulation bandwidth; and
            activate the second ET voltage circuit and deactivate the first ET voltage circuit to provide the second ET voltage to the output port as the modulated voltage in response to the RF signal being modulated in the second modulation bandwidth.

12. The ET apparatus of claim 11 wherein:
    the first ET voltage circuit comprises:
        a first voltage amplifier configured to generate a first initial ET voltage and source a first high-frequency current based on an ET target voltage and a first supply voltage; and a first offset capacitor having a first capacitance and configured to raise the first initial ET voltage by a first offset voltage to generate the first ET voltage; and the second ET voltage circuit comprises:

a second voltage amplifier configured to generate a second initial ET voltage and source a second high-frequency current based on the ET target voltage and a second supply voltage; and a second offset capacitor having a second capacitance and configured to raise the second initial ET voltage by a second offset voltage to generate the second ET voltage.

13. The ET apparatus of claim 12 wherein the second capacitance is substantially smaller than the first capacitance.

14. The ET apparatus of claim 12 wherein the second supply voltage is lower than the first supply voltage.

15. The ET apparatus of claim 12 wherein the multi-bandwidth ETIC further comprises a tracker circuit comprising:

a multi-level charge pump (MCP) configured to generate a low-frequency voltage; and a power inductor configured to induce a low-frequency current based on the low-frequency voltage.

16. The ET apparatus of claim 15 wherein the control circuit is further configured to modulate the low-frequency voltage based on a scaled ET target voltage lower than the ET target voltage when the control circuit activates the second ET voltage circuit and deactivates the first ET voltage circuit.

17. The ET apparatus of claim 16 wherein the multi-bandwidth ETIC further comprises a voltage scaler configured to scale the ET target voltage by a predefined scaling factor to generate the scaled ET target voltage.

18. The ET apparatus of claim 16 wherein the control circuit is further configured to modulate the low-frequency voltage based on a feedback of the second initial ET voltage and a feedback of the second high-frequency current.

19. The ET apparatus of claim 11 wherein:

the first ET voltage circuit comprises:

a voltage amplifier configured to generate an initial ET voltage and source a first high-frequency current based on an ET target voltage and a first supply voltage; and a first offset capacitor having a first capacitance and configured to raise the initial ET voltage by a first offset voltage to generate the first ET voltage; and the second ET voltage circuit comprises:

the voltage amplifier configured to generate the initial ET voltage and source a second high-frequency current based on the ET target voltage and a second supply voltage; and a second offset capacitor having a second capacitance and configured to raise the initial ET voltage by a second offset voltage to generate the second ET voltage.

20. The ET apparatus of claim 19 wherein the control circuit is further configured to:

activate the first ET voltage circuit by coupling the voltage amplifier to the first offset capacitor in response to the RF signal being modulated in the first modulation bandwidth; and activate the second ET voltage circuit by coupling the voltage amplifier to the second offset capacitor in response to the RF signal being modulated in the second modulation bandwidth.

* * * * *

UNITED STATES PATENT AND TRADEMARK OFFICE
CERTIFICATE OF CORRECTION

PATENT NO. : 11,018,627 B2  
APPLICATION NO. : 16/590790  
DATED : May 25, 2021  
INVENTOR(S) : Nadim Khlat Page 1 of 1

It is certified that error appears in the above-identified patent and that said Letters Patent is hereby corrected as shown below:

In the Specification

Column 5, Lines 53 and 61, replace "voltage $V_{APTM}$" with --voltage $V_{APT-M}$--.
Column 6, Line 33, replace "2.2. microFarad (g)" with --2.2. microFarad (µF)--.
Column 9, Line 16, replace "(e.g., 90 KHz or 1/2 RB)" with --(e.g., ≤90 KHz or 1/2 RB)--.
Column 10, Line 45, replace "(e.g., 180 KHz or 1 RB)" with --(e.g., ≈180 KHz or 1 RB)--.

Signed and Sealed this  
Twentieth Day of July, 2021

Drew Hirshfeld  
*Performing the Functions and Duties of the*  
*Under Secretary of Commerce for Intellectual Property and*  
*Director of the United States Patent and Trademark Office*